(12) United States Patent
Wallis

(10) Patent No.: US 8,575,595 B2
(45) Date of Patent: Nov. 5, 2013

(54) P-TYPE SEMICONDUCTOR DEVICES

(75) Inventor: David John Wallis, Malvern (GB)

(73) Assignee: Qinetiq Limited, Farnborough (GB)

( * ) Notice: Subject to any disclaimer, the term of this patent is extended or adjusted under 35 U.S.C. 154(b) by 33 days.

(21) Appl. No.: 13/263,638

(22) PCT Filed: Apr. 12, 2010

(86) PCT No.: PCT/GB2010/000742
§ 371 (c)(1),
(2), (4) Date: Oct. 7, 2011

(87) PCT Pub. No.: WO2010/119244
PCT Pub. Date: Oct. 21, 2010

(65) Prior Publication Data
US 2012/0025170 A1    Feb. 2, 2012

(30) Foreign Application Priority Data

Apr. 14, 2009  (GB) .................................. 0906336.3

(51) Int. Cl.
*H01L 29/06* (2006.01)
(52) U.S. Cl.
USPC ............................................. 257/24; 257/18
(58) Field of Classification Search
USPC ..................................... 257/18, 24
See application file for complete search history.

(56) References Cited

U.S. PATENT DOCUMENTS

| | | | |
|---|---|---|---|
| 5,132,247 A | 7/1992 | Chikyou et al. | |
| 5,548,128 A * | 8/1996 | Soref et al. ........................ | 257/18 |
| 6,455,397 B1 | 9/2002 | Belford | |
| 7,145,167 B1 | 12/2006 | Chu | |
| 2002/0140012 A1 | 10/2002 | Droopad | |
| 2005/0213627 A1* | 9/2005 | Masselink et al. ....... | 372/45.011 |
| 2007/0008999 A1* | 1/2007 | Breznay et al. ............ | 372/45.01 |
| 2008/0210949 A1 | 9/2008 | Makabe et al. | |
| 2009/0085027 A1 | 4/2009 | Jin et al. | |

FOREIGN PATENT DOCUMENTS

| | | | |
|---|---|---|---|
| GB | 232506 | | 4/1925 |
| GB | 2084396 | * | 9/1980 |
| GB | 2 084 396 A | | 4/1982 |
| WO | WO 01/91188 A2 | | 11/2001 |
| WO | WO 2005/053030 A1 | | 6/2005 |

OTHER PUBLICATIONS

Mason et al., On the stability of psuedomorphic alpha-Sn on In Sb(001) to temperature and film thickness, 1992, Surface Scienece Letters, 273, L472-L476.*

(Continued)

*Primary Examiner* — Ha Tran T Nguyen
*Assistant Examiner* — Paul Noel
(74) *Attorney, Agent, or Firm* — Oliff & Berridge, PLC

(57) ABSTRACT

A semiconductor device comprises an active layer above a first confinement layer. The active layer comprises a layer of α-Sn less than 20 nm thick. The first confinement layer is formed of material with a wider band gap than α-Sn, wherein the band gap offset between α-Sn and this material allows confinement of charge carriers in the active layer so that the active layer acts as a quantum well. A similar second confinement layer may be formed over the active layer. This semiconductor device may be a p-FET. A method of fabricating such a semiconductor device is described.

18 Claims, 4 Drawing Sheets

(56) References Cited

OTHER PUBLICATIONS

M. Kimata et al., "Stabilized α-Sn grown at high temperature by molecular beam epitaxy", Journal of Vacuum Science & Technology, vol. 12, No. 2, Mar. 1994, pp. 1184-1185.

B. Mason et al., "On the stability of pseudomorphic α-Sn on InSb(001) to temperature and film thickness", Surface Science Letters, vol. 273, No. 3, Jul. 1, 1992, pp. L472-L476.

M. Radosavljevic et al., "High-Performance 40 nm Gate Length InSb P-Channel Compressively Strained Quantum Well Field Effect Transistors for Low-Power ($V_{cc}$=0.5V) Logic Applications", 2008 IEEE International Electron Devices meeting (IEDB 2008), pp. 1-4.

Jul. 8, 2010 International Search Report issued in International Patent Application No. PCT/GB2010/000742.

Jul. 8, Written Opinion of the International Search Authority issued in International Patent Application No. PCT/GB2010/000742.

Oct. 22, 2009 Search Report issued in Great Britain Patent Application No. GB0906336.3.

R.F.C. Farrow et al., The Growth of Metastable, Heteroepitaxial Films of α-Sn by Metal Beam Epitaxy, Journal of Crystal Growth, vol. 54, 1981, pp. 507-518.

R.A. Stradling, "Novel Semiconductor Materials and Structures Produced by MBE and MOCVD", Physica Scripta, (1991), vol. T35, pp. 237-244.

U.S. Appl. No. 13/263,663 in the name of David John Wallis filed Oct. 7, 2011.

U.S. Appl. No. 13/263,621 in the name of David John Wallis et al. filed Oct. 7, 2011.

S. Datta et al., "85nm Gate Length Enhancement and Depletion Mode InSb Quantum Well Transistors for Ultra High Speed and Very Low Power Digital Logic Applications", IEEE, Dec. 5, 2005, pp. 763-766.

Jun. 9, 2010 International Search Report issued in International Application No. PCT/GB2010/000737.

Jun. 9, 2010 Written Opinion of the International Searching Authority issued in International Application No. PCT/GB2010/000737.

T. Ashley et al., "InSb-based Quantun Well Transistors for High Speed, Low Power Applications," 2005 Conference on Compound Semiconductor Manufacture (CS Mantech), 2 pages.

Oct. 9, 2009 Search Report issued in Great Britain Application No. GB0906331.4.

J.W. Matthews et al., "Defects in Epitaxial Multilayers", Journal of Crystal Growth, vol. 29, 1975, pp. 273-280.

F. Yuan, et al., "Mobility Enhancement Technology", IEEE, Oct. 23, 2006, pp. 1116-1119.

May 28, 2010 International Search Report issued in International Application No. PCT/GB2010/000713.

May 28, 2010 Written Opinion of the International Search Authority issued in International Application No. PCT/GB2010/000713.

Oct. 14, 2009 Search Report issued in Great Britain Application No. GB0906333.0.

T. Ghani et al., "A 90nm High Volume Manufacturing Logic Technology Featuring Novel 45nm Gate Length Strained Silicon CMOS Transistors", IEEE, 2003, pp. 11.6.1-11.6.3.

H. Yin et al., "Tunable uniaxial vs biaxial in-plane strain using compliant substrates", Applied Physics Letters, (2005), vol. 87, pp. 061922-1-061922-3.

* cited by examiner

P-TYPE SEMICONDUCTOR DEVICES

FIELD OF THE INVENTION

The invention relates to p-type semiconductor devices. It is particularly relevant to p-type field effect transistors.

BACKGROUND TO THE INVENTION

In order to produce improvements to logic circuits, it is desirable to produce device structures, particularly field-effect transistors (FETs), that work at higher frequencies and lower powers. The standard architecture for digital circuit design is CMOS. To achieve CMOS circuits, both n-FETs (with electrons as charge carriers) and p-FETs (with holes as charge carriers) are required.

Conventional CMOS design is largely based on Si semiconductor technology. For n-FETs, very high operational frequencies and low operating powers have been achieved using InSb as a semiconductor. In this system, a layer of $Al_xIn_{1-x}Sb$ is grown on a suitable substrate, such as GaAs, and a thin device layer of InSb grown over this. A donor layer to provide electrons is grown over the device layer, separated from it by a small $Al_xIn_{1-x}Sb$ spacer layer. The device layer is capped by a suitable layer, again $Al_xIn_{1-x}Sb$ to confine the charge carriers in the device layer region, which forms a quantum well. For regions with a composition of $Al_xIn_{1-x}Sb$, the value of x may vary from region to region. InSb has a very high electron mobility, and extremely good results have been achieved—n-FETs with a 350 GHz operating speed and an operating voltage of 0.5 V have been produced.

Strained InSb quantum well structures are also suitable for use in p-FETs. There is a lattice mismatch between the InSb and the $Al_xIn_{1-x}Sb$ which leads to compressive strain in the quantum well and hence good hole mobility. p-FETs with transconductance and cut-off frequency significantly higher than conventional Si or other III-V semiconductor systems have been achieved. Nonetheless, the performance achievable with p-type strained InSb quantum well field effect transistors (QWFETs) does not compare with that achievable for n-type QWFETs.

Other systems have also been investigated to produce high speed p-channel devices suitable for use in CMOS logic—these systems include SiGe, Ge, InGaSb and carbon nanotubes. None of these system currently provides a route to producing p-FETs with performance comparable to that of n-type indium antimonide QWFETs.

It is therefore desirable to produce a device structure with p-channel properties that allow it to be used in a p-FET with low power and high frequency performance comparable to, and compatible with, that achievable with n-type InSb QWFETs. This would allow formation of high performance p-type and n-type QWFETs to be grown on a common substrate, allowing CMOS logic to be realised with low power consumption.

SUMMARY OF THE INVENTION

Accordingly, in a first aspect the invention provides a semiconductor device comprising: an active layer, comprising a layer of α-Sn less than 20 nm thick; and a first confinement layer below the active layer, wherein the first confinement layer is formed of a material or materials with a wider band gap than α-Sn, wherein the valence band offset between α-Sn and said material or materials allows confinement of charge carriers in the active layer so that the active layer acts as a quantum well.

The semiconductor device is typically a p-type semiconductor device. Preferably, the semiconductor device is a transistor, or a precursor structure for a transistor. More preferably, the semiconductor device is a field effect transistor, or a precursor structure therefor. Most preferably, the semiconductor device is a p-type field effect transistor or a precursor structure for a p-type field effect transistor.

α-Sn has an extremely high hole mobility—reported as 2400 $cm^2/Vs$, approximately twice that of InSb—and has been recognised by the present inventors as particularly suitable for use in QWFETs as its crystal properties are similar to those of InSb. It is thus particularly suitable for use in an active layer in which the charge carriers are holes, and in which the active layer forms a p-channel.

This structure will function if there is no layer adjoining the other side of the active layer to the side adjacent to the first confinement layer. Advantageously, there may be a second confinement layer on that side of the active layer, formed of the same type of material as the first confinement layer.

The p-channel properties of such an active layer are enhanced if it is placed under compressive strain. Advantageously, there is at least 1% of strain between the active layer and at least one of the first confinement layer and the second confinement layer. This may be achieved by substituting an α-Sn layer for an InSb in a conventional InSb device structure. In this case, at least one of the first confinement layer and the second confinement layer comprises a ternary III-V semiconductor, preferably one or both being $Al_xIn_{1-x}Sb$, with x typically lying between 0.1 and 0.6 and more preferably lying between 0.30 and 0.45. Other possible ternary III-V semiconductors are InGaSb and/or AlGaSb.

The first confinement layer may be a buffer layer between the active layer and a substrate. The substrate (which is preferably of GaAs or Si) may be miscut with respect to a crystal plane to prevent the creation of antiphase domain boundaries when a III-V layer is grown over a group IV layer. The active layer may contain up to 2% of dopants—preferably Si or Ge—to stabilise the α-Sn layer against a phase transition to β-Sn.

Preferably, the semiconductor device is a p-FET, and further comprises a source, a drain and a gate all disposed over the second confinement layer, wherein the gate is positioned between the source and the drain to control current in the p-channel between them. This p-channel structure is particularly suitable for use in p-FETs to achieve performance comparable to that of InSb n-FETs.

Alternatively, the semiconductor device may be a precursor structure for a p-FET, said structure comprising a substrate and epitaxially grown first confinement layer and active layer as described herein. The precursor structure may comprise a second confinement layer above the active layer. Optionally, the precursor structure may comprise a temporary or permanent cap layer, suitable capping materials being well known to the skilled person.

In a further aspect, the invention provides a method of fabricating a semiconductor device comprising the steps of: preparing a substrate; growing a first confinement layer directly or indirectly on the substrate by an epitaxial growth process; and growing an active layer of α-Sn over the first confinement layer by an epitaxial growth process; wherein the first confinement layer is formed of a material or materials with a wider band gap than α-Sn, wherein the band gap offset between α-Sn and said material or materials allows confinement of charge carriers in the active layer so that the active layer acts as a quantum well.

Suitable epitaxial growth processes for use in embodiments of the invention are MBE, MOCVD, ALD, CBE and MECVD—the person skilled in the art will appreciate which of the available epitaxial growth processes will be suitable for growing the layers described here.

In a further aspect, the invention provides a precursor structure for a field-effect transistor, preferably a p-type field-effect transistor, comprising: an active layer comprising a layer of α-Sn less than 20 nm thick; and a first confinement layer below the active layer, wherein the first confinement layer is formed of a material or materials with a wider band gap than α-Sn, wherein the valence band offset between α-Sn and said material or materials allows confinement of charge carriers in the active layer so that the active layer acts as a quantum well.

Preferably—but not necessarily—the precursor structure comprises a second confinement layer above the active layer. Optionally, the precursor structure comprises a capping layer which can—if necessary—be removed before processing the structure into the final transistor device.

In a further aspect, the invention provides the use of α-Sn in an active layer of a QWFET device, the active layer forming a p-channel of said device. Preferably, the α-Sn comprises a layer less than 20 nm thick.

Any feature in one aspect of the invention may be applied to any other aspects of the invention, in any appropriate combination. In particular, device aspects may be applied to method and use aspects, and vice versa. The invention extends to a device and method substantially as herein described, with reference to the accompanying drawings.

SPECIFIC EMBODIMENTS OF THE INVENTION

Specific embodiments of the invention will now be described, by way of example, by reference to the accompanying Figures, of which:

FIG. 1 shows an example of a p-channel structure according to an embodiment of the invention.

The key part of the p-channel structure is a quantum well layer 1 composed of α-Sn. This quantum well layer 1 is grown on a buffer layer 2 of a material with suitable band gap and crystal structure—$Al_xIn_{1-x}Sb$ is a suitable buffer layer material. The buffer forms a bottom barrier for the quantum well. The buffer layer 2 is shown here as formed on a substrate 3, for which a suitable substance would be GaAs, though Si is also a possible substrate choice. To confine the charge carriers (holes) in the p-channel, a further top barrier layer 4 may also be provided over the quantum well layer 1. This is again $Al_xIn_{1-x}Sb$ in the example shown. This arrangement provides the basic device structure, though refinements to this structure are described further below α-Sn has an extremely high hole mobility—reported as 2400 $cm^2/Vs$, approximately twice that of InSb. Hole mobility is enhanced by growth on an $Al_xIn_{1-x}Sb$ buffer layer, as this will result in placing the quantum well layer under compressive strain because of the mismatch between the zincblende structure lattice of $Al_xIn_{1-x}Sb$ and the diamond cubic lattice structure of α-Sn. α-Sn has a lattice parameter of 0.64912 nm and is therefore a good lattice match to InSb, enabling it to be effectively substituted for InSb in InSb based device structures. This means that α-Sn is also compatible with n-type devices based on InSb, so the two types of device can be provided together on a common substrate. This provides the possibility of high speed and low power CMOS logic.

Figure 2:
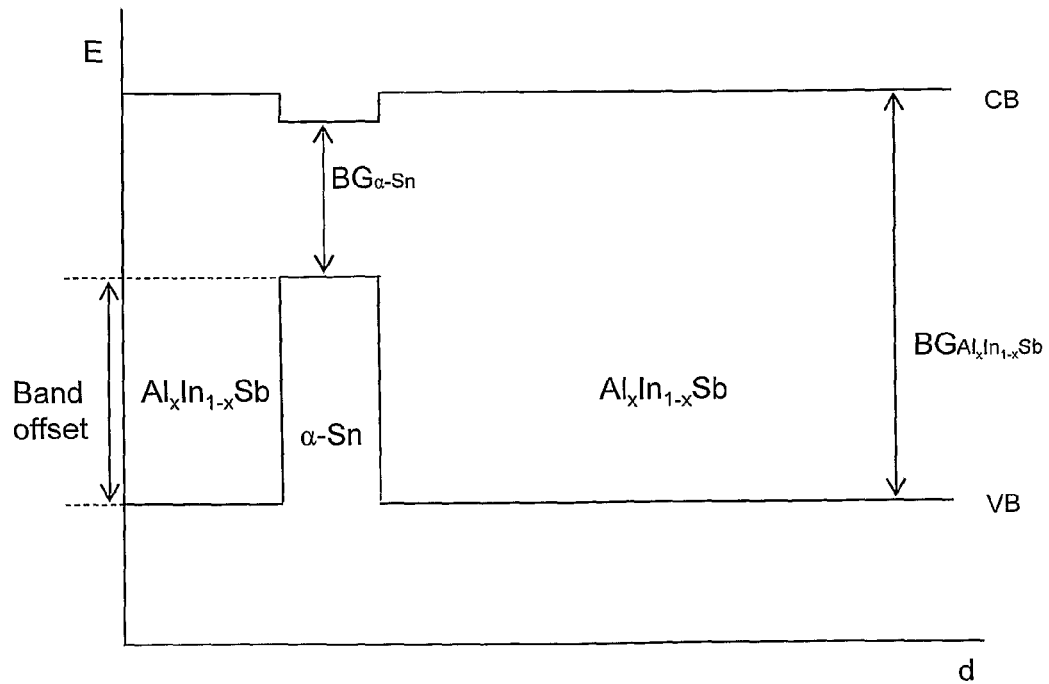
FIG. 2 illustrates band gaps for the p-channel structure of FIG. 1.

FIG. 2 illustrates the band gaps for this structure against distance. As can be seen, the small band gap in α-Sn and the large band offset between the valence bands of α-Sn and of $Al_xIn_{1-x}Sb$ (the valence band offset of α-Sn is approximately 0.4 eV relative to InSb) provide excellent hole confinement. The offset between the conduction bands is relatively small—although this is not a fundamental problem (as this is a p-channel, not an n-channel, so electrons are not the carrier) but could be an issue if the conduction band of α-Sn lay above the conduction band of $Al_xIn_{1-x}Sb$, as this could result in an anti-well, which could affect the performance of the p-channel. The band gap in $Al_xIn_{1-x}Sb$ can be increased by increasing x (and so increasing the Al fraction)—this parameter can be controlled to obtain satisfactory channel properties.

Figure 1:
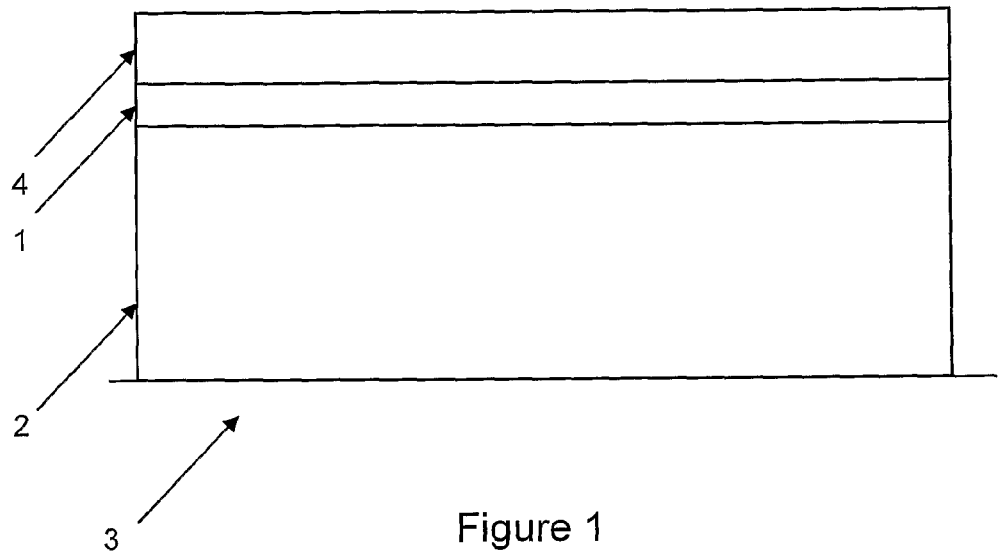
FIG. 1 shows a p-channel structure according to an embodiment of the invention.
Figure 3:
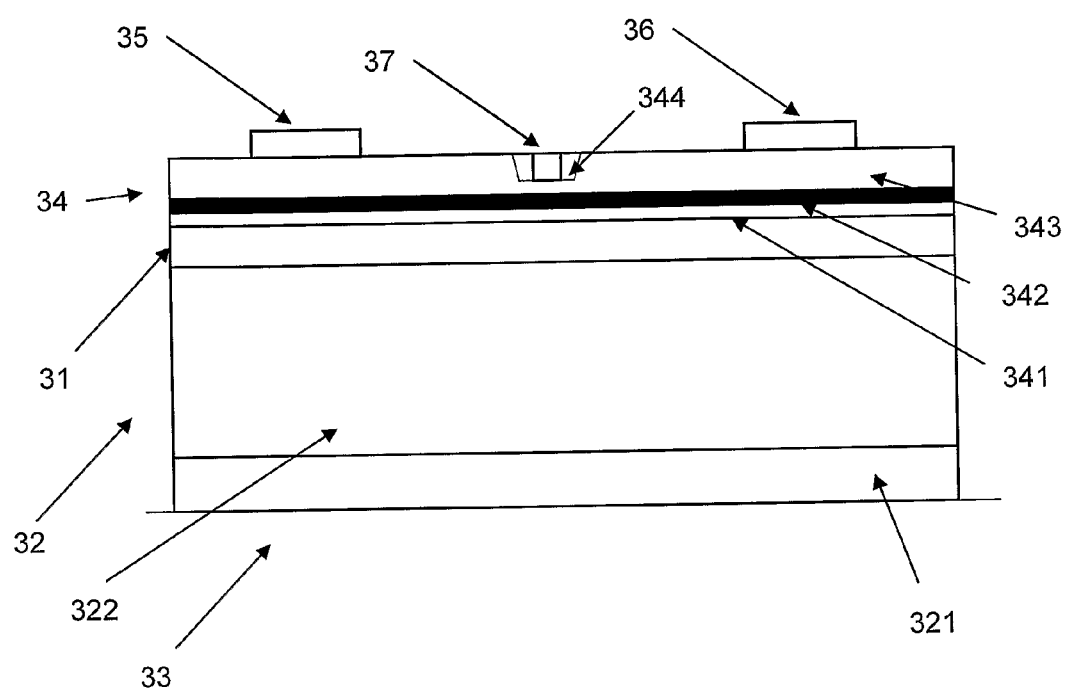
FIG. 3 shows a p-FET using a p-channel structure of the type shown in FIG. 1.

FIG. 3 illustrates a p-FET employing a p-channel of the type shown in FIG. 1—further details of a practical basic semiconductor device structure as described above are also provided. The buffer layer 32 of $Al_xIn_{1-x}Sb$, which includes a lower confinement layer 322, is grown on a substrate of GaAs 33. The α-Sn quantum well 31 is capped by an upper layer 34, which includes an upper confinement layer 343. A source 35 and a drain 36 are formed over the upper layer 34. The p-channel is controlled by a gate 37 placed between the source and the drain.

The buffer layer 32 may be from 1 to 3 μm in thickness. Adjacent to the substrate is an Al-rich accommodation layer 321 of $Al_xIn_{1-x}Sb$ lying between the substrate 31 and the lower confinement layer 322.

The α-Sn quantum well 31 is typically about 5 nm in thickness—thick enough for there to be enough energy states available for low carrier mass, but thin enough to form an effective quantum well structure and not to exceed the critical thickness for relaxation, which would lead to creation of dislocations at the surface of the quantum well structure and serious deterioration in the electrical properties of the channel.

The upper layer 34 may be up to about 20 nm in thickness—this needs to be thick enough to confine the carriers effectively, but thin enough to allow the gate voltage to control conduction through the quantum well layer effectively. It has several sub-layers in order to achieve certain desired electrical properties. A dopant sheet 342 is provided: this may use δ-doping to provide carriers for the channel—for a p-channel of this type, Be δ-doping is appropriate for this purpose. The dopant sheet 342 is separated from the quantum well structure of the active layer 31 by a spacer layer 341 of $Al_xIn_{1-x}Sb$, which may be relatively thin (for example, 3 nm thick). The upper confinement layer 343, also formed from $Al_xIn_{1-x}Sb$, is formed over the dopant sheet 342 and serves to confine charge carriers in the active layer 31. Alternatively (not shown in the Figures) a dopant layer may be formed in the upper part of the lower confinement layer in a similar way.

This upper confinement layer 343 needs to be sufficiently thick to confine charge carriers effectively (should the device as a whole be designed that charge carriers would otherwise have a leakage path) but sufficiently thin to allow the gate 37 to control the active layer 31 appropriately. Such gate control may be allowed by etching back the upper confinement layer 343 to form a trench 344 in which the gate 37 is located. The upper part of the upper confinement layer 343 may be p-doped to provide a better conductive contact to the source 35 and the drain 36.

Figure 4:
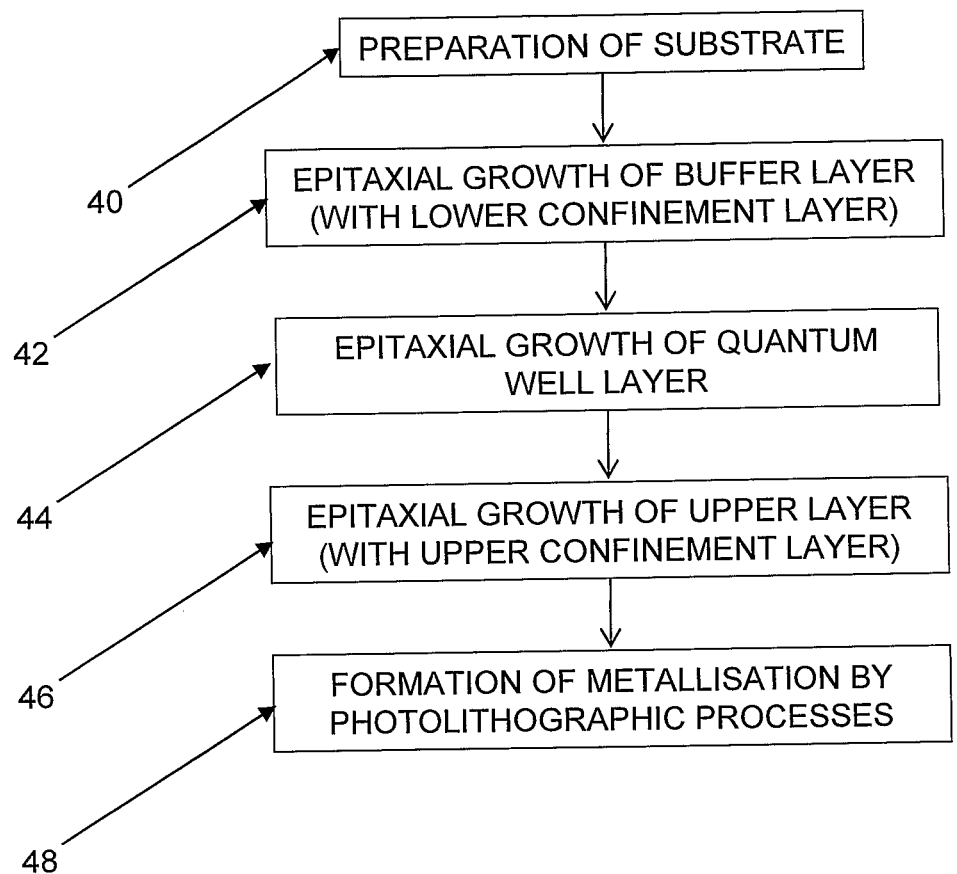
FIG. 4 illustrates a process for growth of the p-FET of FIG. 3.

Conventional deposition techniques may be employed for deposition of $Al_xIn_{1-x}Sb$ and α-Sn layers—both molecular beam epitaxy (MBE) and metalorganic chemical vapour deposition (MOCVD) are both particularly suitable processes. As the person skilled in the art will appreciate, any suitable epitaxial growth process may be used—ALD, CBE and MECVD are among the alternative processes available. The metallisation layer above is formed by normal lithographic techniques—this may involve photolithography or e-beam lithography, for example. Some special considerations arise in device fabrication to ensure satisfactory layer properties and quality. These are discussed below with reference to FIG. 4, which provides a flow diagram description of the processes involved in growth of the p-FET structure of FIG. 3.

Figure 5A:
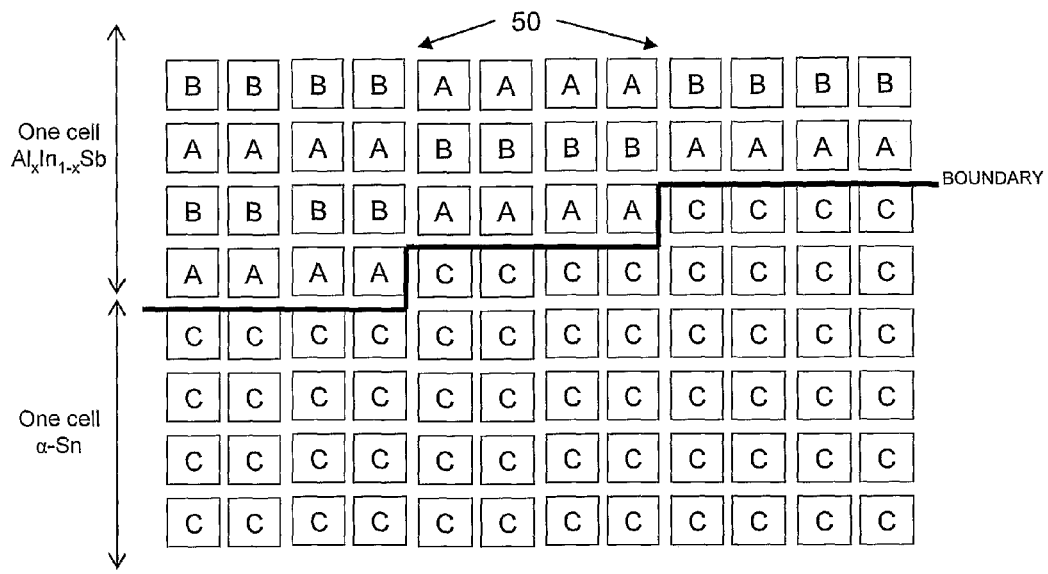
FIGS. 5A and 5B illustrate growth of a Group IV material layer over a III-V material layer using planar cut and miscut substrates respectively.

The devices are grown on a suitably prepared (step 40) semiconductor substrate 33—GaAs is a preferred substrate choice for InSb systems, and as such is suitable here as α-Sn is effectively substituted for In Sb in an InSb quantum well system. Other choices of substrate suitable for use with an InSb system are also possible, as the person skilled in the art will appreciate. One practical issue in growth of the material does affect substrate preparation. α-Sn is a type IV material, and is being grown above one III-V material and a further III-V material will be grown above it. This creates one potential source of difficulty, as while III-V materials will only split or grow in units of half a cell, a group IV material will grow in units of a quarter of a cell. This causes no particular difficulty in growing the group IV material on the III-V material—the material may contain steps of half cell height, which creates no issues in growth of the group IV material—but may cause considerable difficulty in growth of the III-V material. This is because the group IV layer surface may contain steps of a quarter cell height. Growth of III-V material on such steps will lead to antiphase domain boundaries 50 (as shown in FIG. 5A), leading to defects which can affect the properties of the semiconductor device.

Figure 5B:
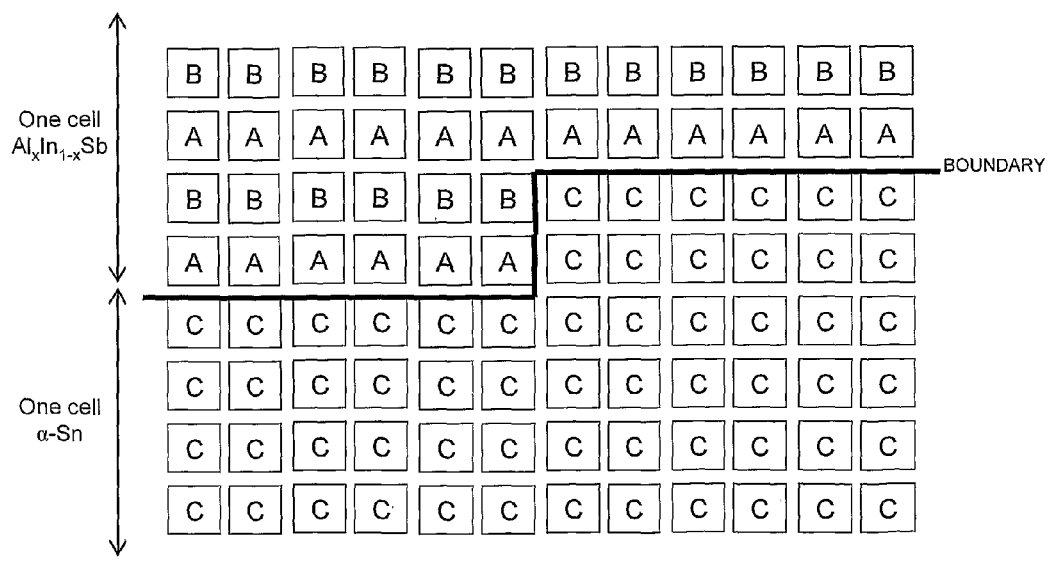

A solution to this problem of growth of a III-V material on a group IV material may be found in using a significantly miscut substrate in the range of 0.5° to 4°, but preferably about 2° towards the (111) type planes. For a GaAs substrate, this could be a substantial miscut from the (001) crystal plane. The use of such a miscut substrate forces layers grown over it to have only coarser steps—it is energetically disadvantageous for narrow quarter cell height steps to form in the group IV layer. The result at the upper surface of the group IV layer is shown in FIG. 5B—the coarser steps largely prevent the creation of antiphase domain boundaries. A similar miscut is desirable for a Si substrate.

The buffer layer 32, which contains a lower confinement layer 322 for the carriers in the quantum well structure, is made of $Al_xIn_{1-x}Sb$ and may be formed (step 42) by any suitable approach for forming device structures of this material. As stated above, this will typically be an epitaxial growth process—both MBE and MOCVD are regularly used to grow InSb systems, but other epitaxial growth processes could also be employed. The growth of $Al_xIn_{1-x}Sb$ layers is well understood by the person skilled in the art and will not be discussed further here.

As is the case for InSb, the lattice mismatch between $Al_xIn_{1-x}Sb$ and α-Sn is such that it results in compressive strain on the α-Sn layer. This is generally advantageous for device properties, but for both InSb and α-Sn p-channels it is desirable to make further adaptations to improve device performance.

There is a limit to the thickness to which an epitaxial layer may be grown on another layer to which it has a significant lattice mismatch without introducing misfit dislocations at the interface between the layers. Such misfit dislocations will reduce hole mobility and thus significantly affect the desired electrical properties of a device. This thickness may be increased by freezing strain of opposing sign into the layer on which the mismatched epitaxial layer will be grown—this can be done in a buffer layer $Al_xIn_{1-x}Sb$ in growing a lower Al fraction $Al_xIn_{1-x}Sb$ layer (for example, 2.5 μm of $Al_{0.3}In_{0.7}Sb$) under a higher Al fraction $Al_xIn_{1-x}Sb$ layer thin enough for strain to be trapped in it (for example, 0.5 μm of $Al_{0.35}In_{0.65}Sb$), the strain being introduced by the different lattice parameters and thermal expansion moduli of the two $Al_xIn_{1-x}Sb$ layers. This is described in more detail in the applicant's British patent application GB 0906331.4 and co-pending PCT application of even date entitled "Strain Control in Semiconductor Devices", which are incorporated by reference herein to the extent permitted by law.

Compressive strain in current flow direction enhances hole mobility in semiconductor systems generally—this has been well researched in Si systems and been found applicable to other group IV and also to III-V semiconductor systems. In systems such as InSb or α-Sn on $Al_xIn_{1-x}Sb$, a hole mobility benefit is provided by the biaxial compressive strain caused by the lattice mismatch between the layers. A further benefit could in principle be provided by placing this system under further compressive strain in the current flow direction, but this could lead to such high overall levels of compressive strain that material failures could result. An alternative approach to providing increased compressive strain in the current flow direction compared to the in-plane direction orthogonal to current flow can be achieved by using tensile uniaxial strain in this orthogonal direction. This is described in more detail in the applicant's British patent application GB 0906333.0 and co-pending PCT application of even date entitled "Uniaxial Tensile Strain in Semiconductor Devices", which are incorporated by reference herein to the extent permitted by law.

The α-Sn layer 31 is now formed (step 44) on the $Al_xIn_{1-x}Sb$ upper confinement layer 322 of the buffer layer 32. Formation of α-Sn layers on InSb systems has been studied extensively, for example by Farrow et al in Journal of Crystal Growth vol. 54 (1981), pp 507-518, which discusses the growth of heteroepitaxial films of α-Sn by MBE. Practical difficulties in achieving effective layers of α-Sn arise in preventing phase transition to the higher temperature β-Sn metallic state, which does not have the electrical properties required.

This is not a significant issue for the growth of the α-Sn layer 31 itself—while the buffer layer 32 of $Al_xIn_{1-x}Sb$ would typically be grown at a temperature (350° C.) which may well cause the unwanted phase transition, the working temperature may be cooled to a much lower value (for example, −20° C. for Farrow) before deposition of Sn. The practical concern arises if a further layer of $Al_xIn_{1-x}Sb$, the second confinement layer 34, is to be grown (step 46) over the α-Sn layer 31. As indicated above, it is normal to grow a layer of $Al_xIn_{1-x}Sb$ at a temperature which may well cause the unwanted phase transition.

In practice, the α-Sn phase is more stable in the α-Sn layer 31 than it is in bulk, and it can be stabilised further. As noted by Stradling in Physica Scripta Vol. T35, 237-244, and by Mason & Williams in Surface Science Letters Vol. 273 (1992)

L472-L476, a thin film of α-Sn grown on a lattice mismatched substrate is stable at significantly higher temperatures (150-200° C.) than is α-Sn in bulk. The α-Sn layer 31 may be further stabilised by doping—doping of up to 2% with Si or Ge can stabilise this layer without significant deterioration of the desirable electrical properties of the resulting p-channel, though greater levels of doping would affect these electrical properties more significantly.

The growth of the upper layer (step 46) may itself be moderated to prevent destabilisation of the α-Sn layer 31. The $Al_xIn_{1-x}Sb$ of the upper layer 34 itself may be grown at a reduced temperature (less than 200° C.) to prevent destabilisation of the α-Sn layer 31. This is not an optimal temperature for $Al_xIn_{1-x}Sb$ growth, but it can still be grown with adequate properties at this temperature. Alternatively, growth may be started at this lower temperature, but the temperature may be raised after a monolayer or more of $Al_xIn_{1-x}Sb$ has been deposited, as the α-Sn layer 31 should be still further stabilised against phase transition when it is sandwiched between two $Al_xIn_{1-x}Sb$ layers—for example, the spacer layer 341 may be grown at a lower temperature, with reversion to a more normal growth temperature for the upper confinement layer 343 itself. A still further alternative would be to use a different material for the upper layer which can be grown to high quality at lower temperatures, such as a low temperature oxide. Oxides used in semiconductor applications include $SiO_2$, $HfO_2$, $GdO_2$, $Al_2O_3$ and $Ga_2O_3$.

As indicated above, another practical issue in the growth of the upper layer 34 is the prevention of antiphase domain boundaries which may arise in growing III-V layers on a layer of group IV material. As discussed above, this is addressed by growing the device structure on a miscut substrate. The formation of the spacer layer 341, the dopant sheet 342, the upper confinement layer 343 and the trench 344 is conventional, as will be appreciated by the person skilled in the art, and will not be discussed further here.

The source 35, the drain 36 and the gate 37 are then formed (step 48) in a conventional way by lithographic processes, such as photolithographic or e-beam lithographic processes—typically metallisation is followed by creation of a photolithographic mask and etching back of the metallisation layer with subsequent removal of the mask to form the metal pads required. These complete the p-FET, and the device can then simply be connected to other circuit elements in any conventional way by wiring to the metal pads.

Further discussion of the fabrication and structure of an InSb strained QWFET can be found in "High-Performance 40 nm Gate Length InSb p-Channel Compressively Strained Quantum Well Field Effect Transistors for Low-Power ($V_{cc}$=0.5) Logic Applications by M. Radosavljevic et al, a paper presented to the 2008 IEEE International Electron Devices Meeting (IEDB 2008). The general principles set out in this discussion concerning p-FETs using a strained quantum well active layer based on an InSb system are appropriate for use in embodiments of the present invention.

The invention claimed is:

1. A semiconductor device comprising:
   an active layer comprising a layer of α-Sn less than 20 nm thick;
   a first confinement layer below the active layer, wherein the first confinement layer is formed of a material or materials with a wider band gap than α-Sn, wherein the band gap offset between α-Sn and said material or materials allows confinement of charge carriers in the active layer so that the active layer acts as a quantum well;
   a second confinement layer above the active layer;
   a source;
   a drain; and
   a gate, the source, the drain and the gate all disposed over the second confinement layer, such that the gate is positioned between the source and the drain to control current in a p-channel between the source and the drain;
   wherein the semiconductor device is a p-FET.

2. A semiconductor device as claimed in claim 1, wherein the second confinement layer is also formed of a material or materials with a wider band gap than α-Sn, wherein the band gap offset between α-Sn and said material or materials allows confinement of charge carriers in the active layer.

3. A semiconductor device as claimed in claim 1, wherein the active layer is doped with up to 2% of Si, Ge or a combination thereof.

4. A semiconductor device as claimed in claim 1, wherein the charge carriers in the active layer are holes, and the active layer forms a p-channel.

5. A semiconductor device as claimed in claim 2, wherein there is at least 1% of strain between the active layer and at least one of the first confinement layer and the second confinement layer.

6. A semiconductor device as claimed in claim 2, wherein at least one of the first confinement layer and the second confinement layer comprises a ternary III-V semiconductor.

7. A semiconductor device as claimed in claim 6, wherein at least one of the first confinement layer and the second confinement layer comprises $Al_xIn_{1-x}Sb$, wherein the value of x lies in the range $0 \leq x \leq 1$.

8. A semiconductor device as claimed in claim 7, wherein both the first confinement layer and the second confinement layer comprise $Al_xIn_{1-x}Sb$, wherein the value of x lies in the range $0 \leq x \leq 1$.

9. A semiconductor device as claimed in claim 7, wherein the value of x lies in the range $0.30 \leq x \leq 0.45$.

10. A semiconductor device as claimed in claim 1 further comprising a substrate, wherein the first confinement layer forms a buffer layer of at least 0.2 μm over the substrate.

11. A semiconductor device as claimed in claim 10, wherein the substrate comprises GaAs or Si.

12. A semiconductor device as claimed in claim 1, wherein the semiconductor device further comprises a dopant sheet adapted to contribute charge carriers to the active layer.

13. A method of fabricating a semiconductor device, wherein the semiconductor device is a p-FET, comprising the steps of:
    preparing a substrate;
    growing a first confinement layer directly or indirectly on the substrate by an epitaxial growth process;
    growing an active layer of α-Sn over the first confinement layer by an epitaxial growth process;
    growing a second confinement layer over the active layer of α-Sn by an epitaxial growth process; and
    forming metal source, drain and gate pads over the second confinement layer by lithographic processes to form the p-FET of which the active layer forms the p-channel;
    wherein:
    the first confinement layer is formed of a material or materials with a wider band gap than α-Sn, wherein the band gap offset between α-Sn and said material or materials allows confinement of charge carriers in the active layer so that the active layer acts as a quantum well, and
    the second confinement layer is also formed of a material or materials with a wider band gap than α-Sn, wherein the band gap offset between α-Sn and said material or materials allows confinement of charge carriers in the active layer.

14. A method as claimed in claim 13, where the step of preparing the substrate comprises preparing a surface substantially miscut to a crystal plane for subsequent growth of the first confinement layer, the active layer and the second confinement layer thereupon.

15. A method as claimed in claim 14, wherein the substrate is GaAs or Si, and the crystal plane is the (001) plane.

16. A method as claimed in claim 13, wherein any confinement layer is formed of $Al_xIn_{1-x}Sb$, wherein the value of x lies in the range $0 \leq x \leq 1$.

17. A method as claimed in claim 16, wherein the value of x lies in the range $0.30 \leq x \leq 0.45$.

18. A method as claimed in claim 13, wherein the growth conditions of the second confinement layer are controlled so as to prevent destabilisation of the active layer.

* * * * *